(12) United States Patent
Dale et al.

(10) Patent No.: US 7,622,972 B2
(45) Date of Patent: Nov. 24, 2009

(54) SYSTEM AND APPARATUS FOR GENERATING IDEAL RISE AND FALL TIME

(75) Inventors: Bret Roberts Dale, Jericho, VT (US);
Darin James Daudelin, Williston, VT (US); Ryan Andrew Jurasek, S. Burlington, VT (US); Dave Eugene Chapmen, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 25 days.

(21) Appl. No.: 12/025,786

(22) Filed: Feb. 5, 2008

(65) Prior Publication Data
US 2009/0195073 A1 Aug. 6, 2009

(51) Int. Cl.
*H03K 5/12* (2006.01)

(52) U.S. Cl. ........................ 327/170; 327/134
(58) Field of Classification Search ........................ None
See application file for complete search history.

(56) References Cited

U.S. PATENT DOCUMENTS

| | | | | | |
|---|---|---|---|---|---|
| 5,883,535 | A | * | 3/1999 | Kato | 327/170 |
| 5,969,513 | A | * | 10/1999 | Clark | 323/282 |
| 2006/0164142 | A1 | * | 7/2006 | Stanley | 327/172 |

* cited by examiner

*Primary Examiner*—Cassandra Cox
(74) *Attorney, Agent, or Firm*—Winston Hsu

(57) ABSTRACT

A system for generating an ideal rise or fall time includes: a first current source, for providing a first current; an adjustable capacitive component, coupled to the first current source, for generating an output signal according to a total capacitance controlled by a comparison signal; a signal conversion circuit, coupled to the adjustable capacitive component, for restoring charges stored in the adjustable capacitive component to a predetermined value when a voltage level of the output signal reaches a reference value to generate a clock-like signal; and a comparison circuit, coupled to the signal conversion circuit and the adjustable capacitive component, for comparing a period of the clock-like signal with a reference period of a reference clock signal and generating the comparison signal to adjust the total capacitance of the adjustable capacitive component when periods are not the same.

17 Claims, 3 Drawing Sheets

SYSTEM AND APPARATUS FOR GENERATING IDEAL RISE AND FALL TIME

BACKGROUND OF THE INVENTION

1. Field of the Invention

The present invention relates to rise and fall times in integrated circuits, and more particularly, to a system for generating an ideal rise and fall time that is independent of temperature and voltage, and a corresponding method.

2. Description of the Prior Art

In an Integrated Circuit (IC), rise and fall times are an indication of how fast the IC can switch between different logic states. ICs, however, are affected by changes in temperate, voltage etc., which also leads to some variation in rise and fall times. In order to avoid this problem, it is necessary to create rise and fall times that are not affected by variations in temperature and voltage. By creating the ideal rise and fall times on-chip, and then using the rise and fall times to calibrate, problems of noise can be avoided.

Please refer to FIG. 1. FIG. 1 is a diagram of a prior art solution for the problem of noise. FIG. 1 shows a system 100 comprising a first P transistor P1 and a second P transistor P2 both coupled to a voltage supply Vcc. The system 100 also shows a first N transistor N1 coupled to P1 and a second N transistor coupled to the voltage supply Vcc. An input drives P2 and N2, and the gates of P1 and N1 are coupled to P2 and N2 respectively. In typical CMOS devices, as temperature rises the rise and fall times will slow down. As the devices P1 and N1 are an inversion stage driven by CMOS logic, and the current is proportional to temperature, the increasing current will also increase the rise and fall times by the same amount the increase in temperature causes them to slow down. Therefore, the rise and fall times remain constant.

This system, however, only compensates for a change in temperature. If the voltage supply were to change, there would be a corresponding shift in the rise and fall times. It is therefore necessary to design a circuit for creating rise and fall times that are independent of both temperature and voltage variation.

SUMMARY OF THE INVENTION

With this in mind, a system and method for generating ideal rise and fall times that are independent of process, temperature and voltage variation is provided.

A system for generating an ideal rise or fall time according to an exemplary embodiment of the present invention comprises: a first current source, for providing a first current; an adjustable capacitive component, coupled to the first current source, for generating an output signal according to a total capacitance controlled by a comparison signal; a signal conversion circuit, coupled to the adjustable capacitive component, for restoring charges stored in the adjustable capacitive component to a predetermined value when a voltage level of the output signal reaches a reference value to generate a clock-like signal; and a comparison circuit, coupled to the signal conversion circuit and the adjustable capacitive component, for comparing a period of the clock-like signal with a reference period of a reference clock signal and generating the comparison signal to adjust the total capacitance of the adjustable capacitive component when periods are not the same.

A method for generating a reference transition time of a system according to an exemplary embodiment of the present invention comprises: providing a first current; generating an output signal according to a total capacitance of the system controlled by a comparison signal; comparing a voltage level of the output signal with a reference value; restoring stored charges to a predetermined value when a voltage level of the output signal reaches a reference value to generate a clock-like signal; comparing a period of the clock-like signal with a reference period of a reference clock signal; and generating the comparison signal to adjust the total capacitance of the system when the periods are not the same.

These and other objectives of the present invention will no doubt become obvious to those of ordinary skill in the art after reading the following detailed description of the preferred embodiment that is illustrated in the various figures and drawings.

DETAILED DESCRIPTION

The method of the present invention creates a known capacitance value that is proportional to a clock signal. Once the capacitance value has been determined then any current can be input to the system to generate a desired rise or fall time.

Figure 1:
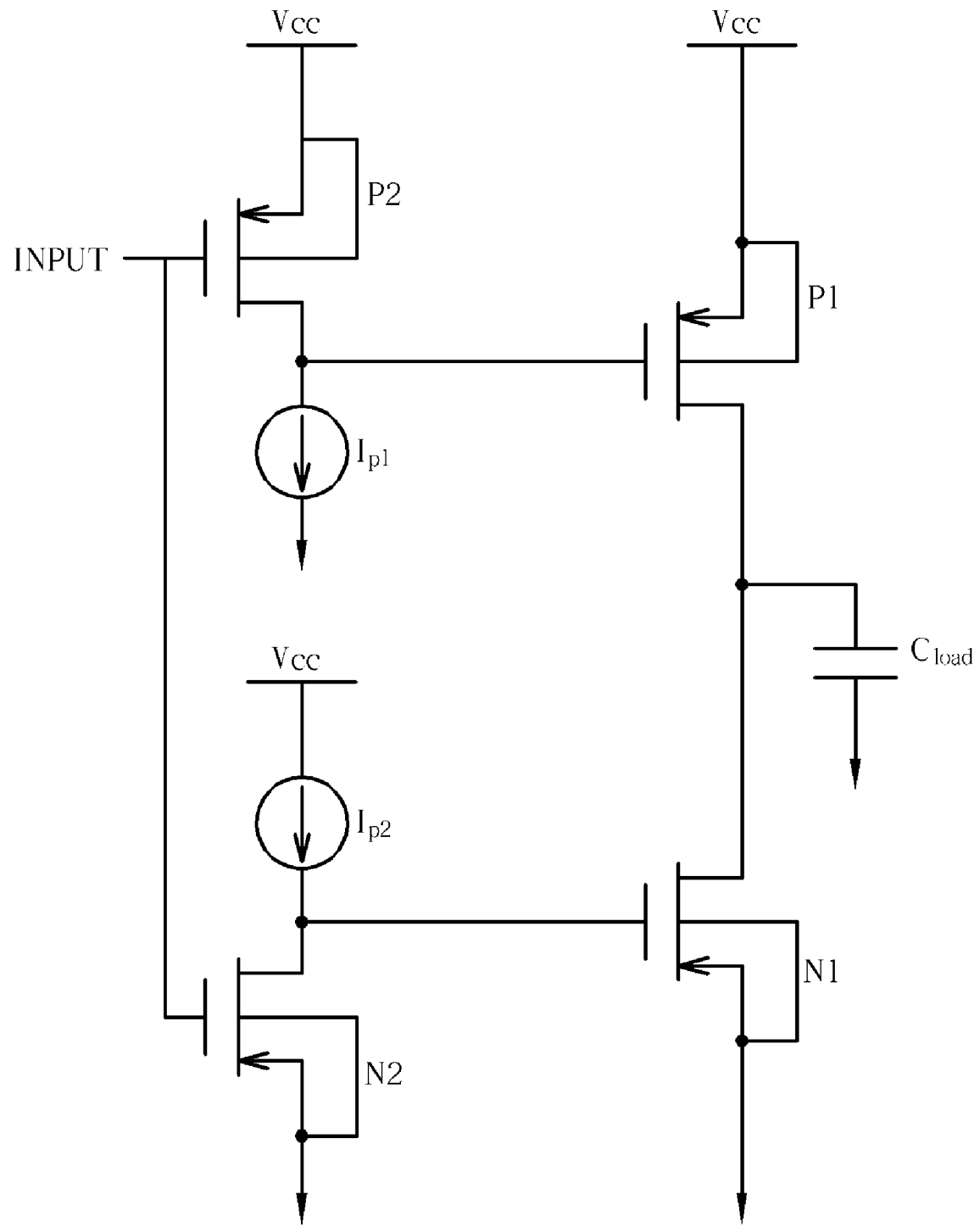
FIG. 1 is a diagram of a prior art system for generating an ideal rise and fall time.
Figure 2:
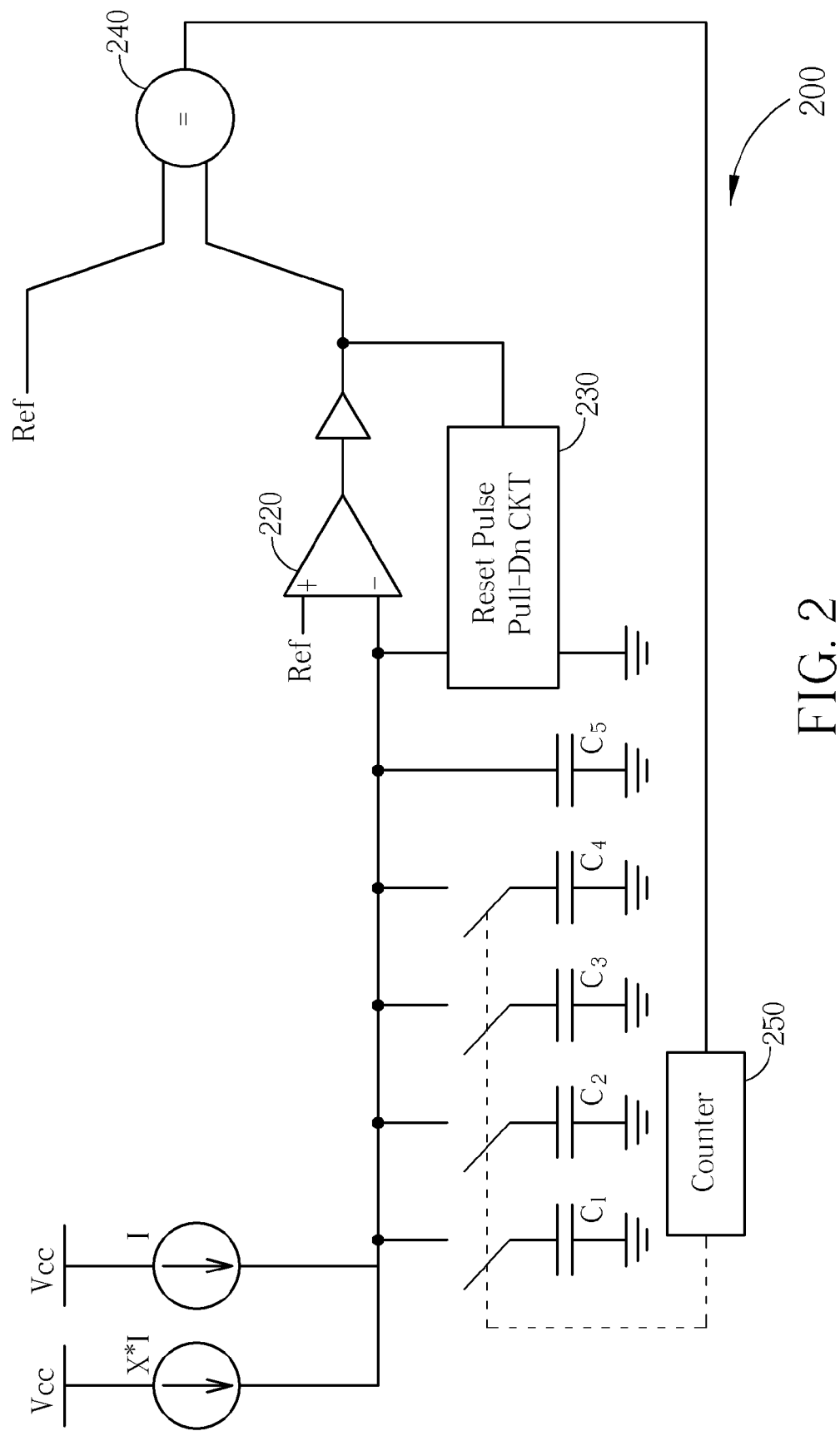
FIG. 2 is a diagram of a system for generating an ideal rise and fall time according to an exemplary embodiment of the present invention.

Please refer to FIG. 2. FIG. 2 is a diagram of a system 200 according to an exemplary embodiment of the present invention. For simplicity, the accompanying description will discuss the method of obtaining an ideal rise time. The system 200 comprises a series of parallel capacitors $C_1$, $C_2$, $C_3$, $C_4$ and $C_5$ coupled to a phase comparator 240. Capacitors $C_1$~$C_4$ can be selectively turned on or off through switches. Please note that the number of capacitors shown here is merely one representation and not a limitation of the present invention. Initially some or one of the capacitors $C_1$~$C_4$ is turned on. A current I is input to the system 200. The stored charge in the capacitor(s) will rise accordingly, and is compared with a reference voltage by a comparator 220. When the reference voltage and the stored charge are equal, the reset pulse circuit 230 will be activated and cause the capacitor(s) to discharge. This process continues until, over time, a sawtooth develops.

This sawtooth is converted into a clock-like signal by the comparator 220. A period of the system T' is a time between two rising edges of the sawtooth or the clock-like signal. This period T' is compared by a phase comparator 240 with a clock signal T in order to generate a comparison signal. This clock signal T is an ideal clock signal that is generated off-chip (from a frequency generator, for example) or it is a frequency divided version of an off-chip clock signal. When the two periods are equal, the total capacitance of the system 200 will give the desired/ideal rise time. When the two periods are not equal, the comparator 240 will generate a comparison signal, for adjusting the total capacitance of the system 200.

The comparison signal is fed into a counter 250 for instructing the counter 250 to turn on or turn off some or one of the parallel capacitors $C_1$~$C_4$. The above processes of generating the sawtooth signal, converting the sawtooth signal into a clock-like signal, and comparing the period T' of the clock-like signal with an ideal clock signal repeats itself until the period T' is found to be the same as the ideal clock signal. At this point, the total capacitance of the system 200 will give the ideal rise time if a current I is input to the system 200. The total capacitance of the system C' is the value of all the turned on capacitors $C_1 \sim C_5$.

The second stage of the operation involves utilizing a factor of the current I (X*I) as an input of the system 200. By varying the amount X, the rise time will also vary. If more current is input to the system then the rise time will be faster, and vice versa. For this operation, the phase comparator 240 is not required.

In the system 200 shown in FIG. 2, the parallel capacitors $C_1 \sim C_5$ can all have the same value, or can be binary weighted capacitors (for example, $C_1$=0.2C, $C_2$=0.1C, $C_3$=0.05C, $C_4$=0.025C). The system 200 can also generate desired fall times. In this case, the parallel capacitors $C_1 \sim C_5$ are charged to a high voltage and then discharged with a discharging current I to generate the sawtooth. The sawtooth is then converted to a clock-like signal, and the discharging period is measured and compared with the ideal clock signal by the phase comparator 240. Once the period T' of the clock-like signal is the same as the period T of the ideal clock signal, a discharging current source X*I proportional to the discharging current I can be input to the system 200 to discharge all turned on capacitors for generating a desired fall time.

Figure 3:
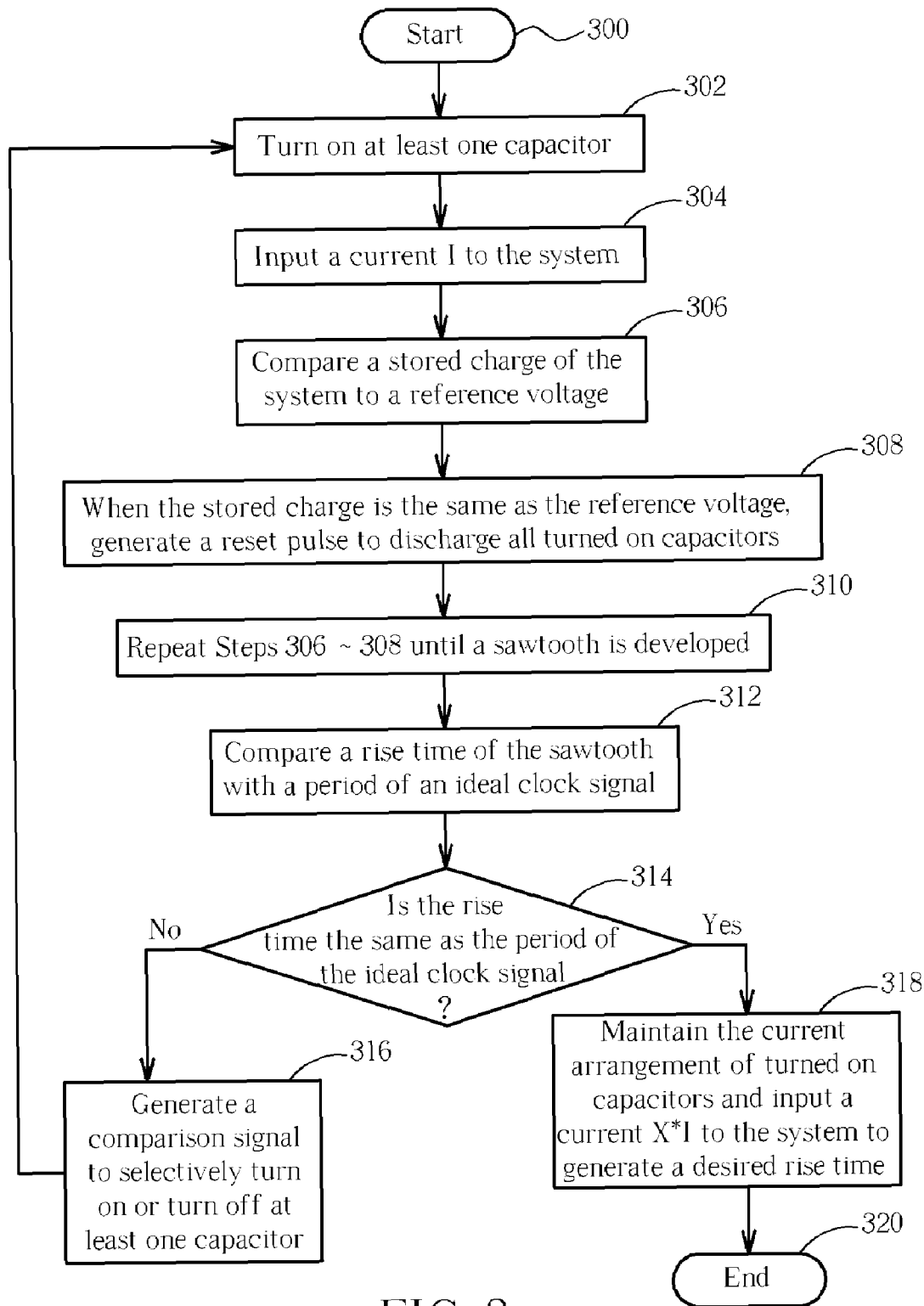
FIG. 3 is a flowchart detailing the method of the system shown in FIG. 2.

FIG. 3 is a flowchart detailing the steps of the method. Please note that this method refers to generating a desired rise time, but those skilled in the art can easily transfer the stages to generating a desired fall time by studying the flowchart and the description above. The steps shown in FIG. 3 are detailed below.

Step 300: Start;
Step 302: Turn on at least one capacitor;
Step 304: Input a current I to the system;
Step 306: Compare a stored charge of the system to a reference voltage;
Step 308: When the stored charge is the same as the reference voltage, generate a reset pulse to discharge all turned on capacitors;
Step 310: Repeat Steps 306~308 until a sawtooth is developed;
Step 312: Compare a rise time of the sawtooth with a period of an ideal clock signal;
Step 314: Is the rise time the same as the period of the ideal clock signal? If yes go to Step 318; if no go to Step 316;
Step 316: Generate a comparison signal to selectively turn on or turn off at least one capacitor. Go back to Step 302;
Step 318: Maintain the current arrangement of turned on capacitors and input a current X*I to the system to generate a desired rise time;
Step 320: End.

By first determining a known capacitance of the system 200 through the comparison and adjusting stages (utilizing the comparison circuit 220 and phase comparator 240 to generate a comparison signal to the counter 250 for turning on/turning off capacitors), a PVT (process, temperature, voltage) independent current source can then be input to the system 200 and the value altered to directly alter a rise or fall time of the system 200. The step of determining a known capacitance can also be utilized independently for cases where manufacturers do not wish to see capacitances change due to process, temperature or voltage.

Those skilled in the art will readily observe that numerous modifications and alterations of the device and method may be made while retaining the teachings of the invention.

What is claimed is:

1. A system for generating a reference transition time, the system comprising:

a first current source, for providing a first current;
an adjustable capacitive component, coupled to the first current source, for generating an output signal according to a total capacitance controlled by a comparison signal;
a signal conversion circuit, coupled to the adjustable capacitive component, for controlling charges stored in the adjustable capacitive component to return to an initial value when a voltage level of the output signal reaches a reference value to generate a periodic signal, rising or falling edges of the periodic signal corresponding to the charges stored in the adjustable capacitive component returning to the initial value; and
a comparison circuit, coupled to the signal conversion circuit and the adjustable capacitive component, for comparing a period of the periodic signal with a reference period of a reference clock signal and generating the comparison signal to adjust the total capacitance of the adjustable capacitive component when the periods are not the same.

2. The system of claim 1, wherein the adjustable capacitive component comprises:
a plurality of parallel capacitors; and
a controller, coupled to the parallel capacitors, for receiving the comparison signal and utilizing the comparison signal to selectively turn on or turn off at least one of the parallel capacitors.

3. The system of claim 2, wherein the controller is a counter for counting the comparison signal to selectively turn on or turn off at least one of the parallel capacitors.

4. The system of claim 2, wherein the plurality of parallel capacitors are binary weighted capacitors.

5. The system of claim 2, wherein the plurality of parallel capacitors each have a same capacitance.

6. The system of claim 1, wherein the signal conversion circuit comprises:
a comparator, having a first input node coupled to the reference value, a second input node coupled to the output signal, and an output node for generating the periodic signal; and
a reset pulse circuit, coupled between the output node and the second input node, for controlling charges stored in the adjustable capacitive component to return to the initial value when the voltage level of the output signal reaches the reference value.

7. The system of claim 1, wherein the comparison circuit is a phase comparator.

8. The system of claim 1, further comprising:
an adjustable second current source, for providing a second current proportional to the first current to create an actual transition time proportional to the reference transition time, wherein the second current is input to the adjustable capacitive component after the period of the periodic signal is equal to the reference period of the reference clock signal.

9. The system of claim 1, wherein the first current is a charging current of the adjustable capacitive component, the reference transition time is a rise time, and the signal conversion circuit discharges the adjustable capacitive component when the voltage level of the output signal reaches the reference value.

10. The system of claim 1, wherein the first current is a discharging current of the adjustable capacitive component, the reference transition time is a fall time, and the signal conversion circuit charges the adjustable capacitive component when the voltage level of the output signal reaches the reference value.

11. A method for generating a reference transition time of a system, the method comprising:
- providing a first current;
- generating an output signal according to a total capacitance of the system controlled by a comparison signal;
- comparing a voltage level of the output signal with a reference value;
- controlling stored charges to return to an initial value when a voltage level of the output signal reaches a reference value to generate a periodic signal, rising or falling edges of the periodic signal corresponding to the stored charges returning to the initial value;
- comparing a period of the periodic signal with a reference period of a reference clock signal; and
- generating the comparison signal to adjust the total capacitance of the system when the periods are not the same.

12. The method of claim 11, wherein the total capacitance of the system is provided by a plurality of parallel capacitors, and the step of generating the comparison signal to adjust the total capacitance of the system when the periods are not the same comprises:
- utilizing the comparison signal to selectively turn on or turn off at least one of the parallel capacitors.

13. The method of claim 12, wherein the plurality of parallel capacitors are binary weighted capacitors.

14. The method of claim 12, wherein the plurality of parallel capacitors each have a same capacitance.

15. The method of claim 11, further comprising:
- providing a second current proportional to the first current to create an actual transition time proportional to the reference transition time; and
- inputting the second current to the system after the period of the periodic signal is equal to the reference period of the reference clock signal.

16. The method of claim 12, wherein the first current is a charging current, the reference transition time is a rise time, and the step of controlling stored charges to return to an initial value when a voltage level of the output signal reaches a reference value comprises:
- discharging the plurality of parallel capacitors.

17. The method of claim 12, wherein the first current is a discharging current, the reference transition time is a fall time, and the step of controlling stored charges to return to an initial value when a voltage level of the output signal reaches a reference value comprises:
- charging the plurality of parallel capacitors to the predetermined value.

* * * * *